United States Patent
Schuermann et al.

(10) Patent No.: US 7,328,885 B2
(45) Date of Patent: Feb. 12, 2008

(54) PLASMA RADIATION SOURCE AND DEVICE FOR CREATING A GAS CURTAIN FOR PLASMA RADIATION SOURCES

(75) Inventors: Max C. Schuermann, Luebbecke (DE); Bernd Seher, Jena (DE); Lutz Mueller, Jena (DE); Thomas Missalla, Jena (DE)

(73) Assignee: XTREME Technologies GmbH, Jena (DE)

( * ) Notice: Subject to any disclaimer, the term of this patent is extended or adjusted under 35 U.S.C. 154(b) by 0 days.

(21) Appl. No.: 10/567,942

(22) PCT Filed: Aug. 9, 2004

(86) PCT No.: PCT/DE2004/001802

§ 371 (c)(1),
(2), (4) Date: Feb. 23, 2006

(87) PCT Pub. No.: WO2005/015962

PCT Pub. Date: Feb. 17, 2005

(65) Prior Publication Data

US 2006/0158126 A1 Jul. 20, 2006

(30) Foreign Application Priority Data

Aug. 12, 2003 (DE) ................ 103 37 667

(51) Int. Cl.
*G21G 4/04* (2006.01)
*G21G 4/06* (2006.01)
(52) U.S. Cl. ................ 438/795; 378/119
(58) Field of Classification Search ........... 250/493.1; 378/119, 143
See application file for complete search history.

(56) References Cited

U.S. PATENT DOCUMENTS

| | | | |
|---|---|---|---|
| 4,935,624 A * | 6/1990 | Henion et al. ........... 250/288 |
| 5,963,616 A | 10/1999 | Silfvast et al. | |
| 5,991,360 A | 11/1999 | Matsui et al. | |
| 6,031,241 A | 2/2000 | Silfvast et al. | |
| 6,493,423 B1 * | 12/2002 | Bisschops ............ 378/119 |
| 6,538,257 B2 * | 3/2003 | Bisschops ........... 250/493.1 |
| 2003/0053594 A1 | 3/2003 | Fornaciari et al. | |

FOREIGN PATENT DOCUMENTS

| | | |
|---|---|---|
| EP | 0 174 877 | 8/1989 |
| WO | WO 02/091807 | 11/2002 |
| WO | WO 03/026363 | 3/2003 |

\* cited by examiner

*Primary Examiner*—John R. Lee
(74) *Attorney, Agent, or Firm*—Reed Smith LLP

(57) ABSTRACT

A plasma radiation source is improved in such a way that the lifetime of the optics which is limited by the influence of debris is appreciably increased. A gas curtain through which the radiation proceeding from a source region in a vacuum chamber is emitted at a defined solid angle for debris suppression along an axis of the mean propagation direction of the radiation exits as a radially directed supersonic gas jet from a propulsion nozzle of a gas jet vacuum pump, which propulsion nozzle is arranged on the axis. The gas curtain is directed to an annular mixing nozzle that is arranged coaxial to the axis and is guided out of the vacuum chamber by a diffuser. This makes it possible to use source arrangements having an optimal conversion efficiency but extensive debris.

17 Claims, 3 Drawing Sheets

PLASMA RADIATION SOURCE AND DEVICE FOR CREATING A GAS CURTAIN FOR PLASMA RADIATION SOURCES

CROSS-REFERENCE TO RELATED APPLICATIONS

This application claims priority of International Application No. PCT/DE2004/001802, filed Aug. 9, 2004 and German Application No. 103 37 667.4, filed Aug. 12, 2003, the complete disclosures of which are hereby incorporated by reference.

BACKGROUND OF THE INVENTION a) Field of the Invention

The invention is directed to a plasma radiation source which emits radiation proceeding from a source region in a vacuum chamber along an axis of the mean direction of propagation of the radiation at a defined solid angle through a gas curtain that is provided for debris suppression.

b) Description of the Related Art

The invention is further directed to an arrangement for generating a gas curtain as a filter for particles in radiation whose mean propagation direction in a vacuum chamber extends along an axis directed through the gas curtain.

Plasma radiation sources are used for generating short-wavelength electromagnetic radiation ($\lambda$<110 nm). Lithography using extreme ultraviolet (EUV, 5 nm<$\lambda$<50 nm) is mentioned by way of example. The efficiency of plasma radiation sources depends upon the amount of radiation emitted in the desired wavelength interval in the usable solid angle and upon the size of the usable solid angle. The efficiency of the conversion of energy supplied to the plasma into usable radiation of the desired wavelength interval is known as conversion efficiency (CE). This depends on the plasma conditions (pressure, temperature, density, confinement time, material composition) as well as on the usable solid angle. The plasma can be generated either by an electric gas discharge or by particle bombardment or can be excited by intensive laser radiation.

In order to make use of the generated radiation, optical components are often needed for beam shaping. For lack of sufficiently transparent materials in the above-mentioned wavelength range, these optical components are mirrors or diffraction optics of varying complexity. For the same reason, it is necessary to evacuate the beam guiding system to a pressure that is sufficiently low to prevent gas absorption. Because of this, the optics are directly exposed to the damaging influence of the plasma or debris as it is called. By debris is meant fast particles that escape from the plasma and evaporated or sputtered material from the surroundings of the plasma. This influence limits the lifetime of the required optics. Suitable steps must be taken to ensure a sufficient lifetime of the optics. In principle, this can be accomplished in two different ways:

First, the plasma radiation source can be constructed in such a way that it generates as little debris as possible. This can be influenced, for example, by the type of plasma excitation (gas discharge, particle bombardment, laser excitation), by the design of the plasma environment, and by the choice of material composition of the plasma. Steps of this kind generate additional boundary conditions which frequently work against an optimization of the conversion efficiency. For example, xenon plasmas are often generated in plasma radiation sources for EUV lithography because xenon, as a noble gas, does not undergo any chemical changes and is not precipitated on surfaces. However, xenon is suboptimal from the view point of conversion efficiency in the wavelength range required for EUV lithography. Tin and lithium would be more favorable, but have rarely been used heretofore due to their low melting point and the high debris burden associated with it.

Second, active steps can be undertaken to protect the optics as far as possible from the damaging influence of debris.

Previously known active steps for suppression of debris involve deflection by electric and/or magnetic fields (e.g., U.S. Pat. No. 5,991,360), adsorption on surfaces in the form of a rotating foil structure, or foil traps and mechanical shutters.

While the latter are limited to only very small aperture surfaces in short-pulsed plasma radiation sources because fast shutter times could not be realized otherwise, electric and/or magnetic fields do not act on uncharged or quasi-neutral particle ensembles.

Rotating foil structures present problems with respect to suitability for storage under vacuum, mechanical stability over occurring centrifugal forces and high-precision balancing due to the high rotational speeds on the order of 1000 m/s that are required for intercepting very fast particles.

Foil traps comprise (metal) foils having gaps to which a flow of gas is applied and which must be arranged exactly longitudinal to the radiating direction to prevent power loss. Because of alignment tolerances, manufacturing tolerances and thermal loading, this requirement is often not met with sufficient precision in practice. On the other hand, a sufficient suppression of debris is only achieved with high gas flow rates. This leads to problems in the vacuum system and to loss of radiation output through gas absorption.

Similar problems can also occur in a device for x-ray irradiation according to EP 0 174 877 B1 which provides a flat flowing gas layer in front of an exit window of an evacuated chamber to protect a mask from particles.

OBJECT AND SUMMARY OF THE INVENTION

Therefore, it is the primary object of the invention to improve plasma radiation sources of the type mentioned in the beginning in such a way that the lifetime of the optics which is limited by the influence of debris is appreciably increased. The steps to be taken should counteract the propagation of debris and accordingly make it possible for source schemes whose use was formerly prohibited for reasons pertaining to the lifetime of the optics to be used with optimal conversion efficiency.

This object is met in a plasma radiation source of the type mentioned in the beginning in that a radially directed supersonic gas jet proceeds from a propulsion nozzle of a gas jet vacuum pump, which propulsion nozzle is arranged on the axis of the mean propagation direction of the radiation, is directed to an annular mixing nozzle of the gas jet vacuum pump arranged coaxial to the axis and is guided out of the vacuum chamber by a diffuser.

Although the arrangement will achieve a sufficient debris suppression by itself, it may be combined with other methods for debris suppression.

The plasma radiation source according to the invention can be developed further in a particularly advantageous manner in that a gas discharge is used for plasma excitation and an electrode arrangement with anodes and cathodes arranged next to one another along the axis of the mean propagation direction is provided for the gas discharge.

In a particularly advantageous manner, the electrodes are constructed as liquid metal electrodes having a carrier which is penetrated by a supply channel for a liquid emitter and which is coated at its end facing the plasma with a high-melting porous material into which the supply channel opens.

The device used in the plasma radiation source for debris suppression works efficiently in such a way that "dirty" plasma radiation source schemes can also be used with high conversion efficiency. For example, tin plasma or lithium plasma could also be usable for EUV lithography.

It is also advantageous when a pinch effect generated by the current flow along the axis is additionally supported by an external static or dynamic magnetic field around the plasma.

Of course, the use of the device for debris suppression, according to the invention, is not limited to discharge plasmas. The plasma can also be generated by laser or by particle bombardment.

A particularly efficient use of the radiation emitted by the plasma is achieved when a reflector is provided adjacent to the source region along the axis of the mean propagation direction of the radiation, which reflector refocuses the radiation through the plasma. In this way, the usable solid angle can be doubled. The increase in usable radiation output that can be achieved in this way is limited by the reflectivity of the reflector and by absorption losses. The device for debris suppression, according to the invention, can also be used to protect this reflector in that the gas curtain is adjacent to the source region along the axis of the mean propagation direction of the radiation on both sides.

Further, the above-stated object is met according to the invention by the arrangement mentioned in the beginning for generating a gas curtain in that, in order to generate a supersonic gas jet for the gas curtain, a gas jet vacuum pump with a propulsion nozzle arranged on the axis serves to direct the supersonic gas jet radially to an annular mixing nozzle of the gas jet vacuum pump, which mixing nozzle is arranged coaxial to the axis, and in that a diffuser is provided for guiding the supersonic gas jet out of the vacuum chamber.

The subject matter of the invention is also directed to the gas jet vacuum pump itself which has an annular mixing nozzle whose gas inlet opening faces the annular center, a propulsion nozzle arranged in the annular center for generating a supersonic gas jet that proceeds radially from the propulsion nozzle and is directed to the gas inlet opening, and an annular diffuser (10) which works so as to be directed away from the annular center.

The invention will be described more fully in the following with reference to the schematic drawings.

DESCRIPTION OF THE PREFERRED EMBODIMENTS

Figure 1:
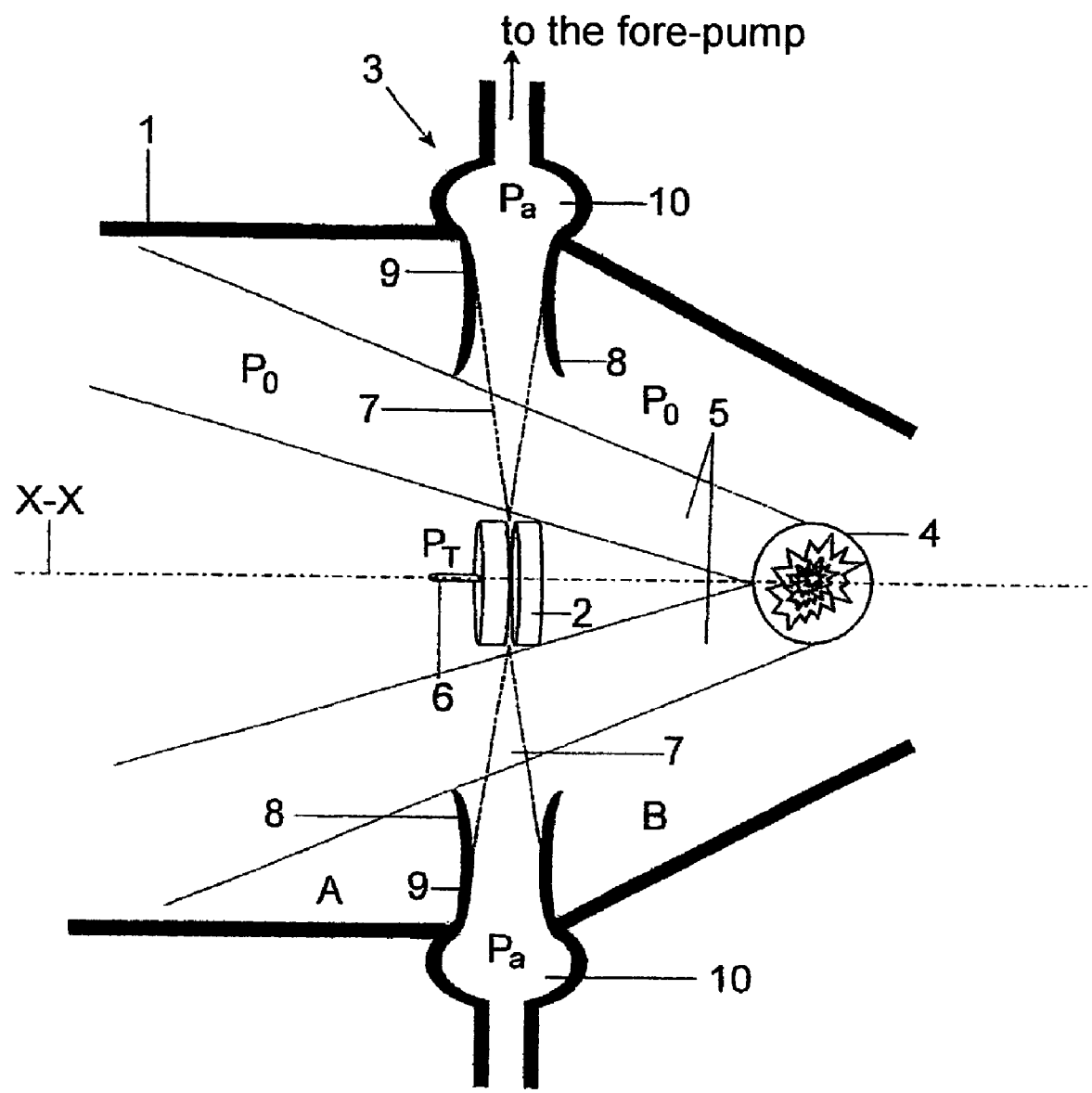
FIG. 1 shows a section from a plasma radiation source with a first construction of a device according to the invention for debris suppression.

In the plasma radiation source shown in FIG. 1, a Laval nozzle serving as a propulsion nozzle 2 of a gas jet vacuum pump 3 is mounted in a vacuum chamber 1 on the axis X-X of the mean propagation direction of radiation 5 generated by a plasma 4.

The propulsion nozzle 2 is acted upon by an inert gas at a propulsion pressure $P_T$ through a supply channel 6 and generates a circular supersonic gas jet 7 that is directed on the radial outside to the chamber wall of the vacuum chamber 1. The supersonic gas jet 7, which can extend at right angles to or at some other angle to the axis X-X or which can also propagate conically, opens into an annular mixing nozzle 8 which tapers to an annular throat 9 and finally passes into the annular diffuser 10 of the gas jet vacuum pump 3. The diffuser 10 is evacuated to a gas pressure $P_G$ by one or more suitable vacuum pumps acting as fore-pumps. The gas jet vacuum pump 3 takes over two functions which are essential for the plasma radiation source according to the invention. On the one hand, it guides the supersonic gas jet 7 through the diffuser 10 out of the vacuum chamber 1 and thus prevents the supersonic gas jet 7 from flooding the vacuum chamber; on the other hand, it (completely or partially) evacuates this vacuum chamber, in addition, to an operating pressure $P_0$. The compression ratio $P_G/P_0$ of the gas jet vacuum pump 3 increases as the expansion ratio $P_T/P_0$ increases, but is also highly dependent on the design of the pump. A high propulsion pressure $P_T$ and low counterpressure PG are always advantageous. Ordinarily, there is a ratio between the pressures of $P_T \gg P_G > P_0$. Roots pumps, for example, can be used as high-output fore-pumps. For example, the following are suitable pressure ranges and pressure ratios:

$P_G = 10^{-3}$ mbar–10 mbar $P_T = 100$ mbar–20 bar $P_G/P_0 > 10 \Rightarrow P_0 < 10^{-4}$ mbar–1 mbar.

The device according to the invention for debris suppression has a gas jet vacuum pump which is outfitted with an annular mixing nozzle 8 whose gas inlet opening faces the annular center in which is arranged a propulsion nozzle for generating a supersonic gas jet 7 which proceeds radially from the propulsion nozzle and is directed to the gas inlet opening. The annular diffuser 10 works so as to be directed away from the annular center.

The supersonic gas jet 7 forms a gas curtain which separates the vacuum chamber 1 into an application region A and a source region B so that any exchange between regions A and B must take place through the gas curtain. This applies to the radiation 5 which is emitted by the plasma 4 and which passes the gas curtain annularly between the propulsion nozzle 2 and mixing nozzle 8 as well as to debris emitted by the source. Unlike radiation, however, the debris is decelerated by the particles of the gas curtain and is subjected to the impulse transfer proceeding from the supersonic gas jet 7 which propels the debris particles into the mixing nozzle 8. When the particle number per area unit and the impulse transfer along the path through the gas curtain to the debris particles is sufficiently high, it is impossible for these debris particles to reach the application region A. The impulse transfer to the debris particles can be increased at a constant path length through the gas curtain in that its particle number density (pressure in the supersonic gas jet 7) and velocity are increased in direction of the mixing nozzle 8. The former can be achieved through an increase in the propulsion pressure $P_T$, which is likewise advantageous for the function of the gas jet vacuum pump 3 described above. The particle velocity can be increased by increasing the temperature of the propulsion gas in front of the propulsion nozzle 2.

An inert gas with a low absorption coefficient in the relevant wavelength of the radiation 5 is used as propellant for the supersonic gas jet 7 in order to maintain a low absorption of the radiation 5 emitted by the plasma 4.

However, the absorption of the radiation 5 and the suppression of debris through the gas curtain are not homogeneous. Both decrease quadratically with the distance to the axis X-X because the particle number density in this direction decreases at a constant particle velocity due to the increasing surface area to be covered. Consequently, the conditions in the device are adjusted in such a way that a sufficient particle number density for adequate debris suppression results in the outer regions of the gas curtain.

An essential criterion for a device for debris suppression is the size of the solid angle which can be opened up around the plasma 4. This solid angle should be as large as possible in order to be able to use high radiation outputs of the plasma 4 in the application region A. In the described arrangement, this solid angle is given by the surface area between the propulsion nozzle 2 and mixing nozzle 10 and by the distance from the plasma 4. This surface area cannot be increased to any desired size because the distance from the propulsion nozzle 2 to the mixing nozzle 10 must remain limited in order to maintain the function of the gas jet vacuum pump 3 and adequate debris suppression. Consequently, it is advisable to minimize the distance between the device and the plasma 4. In this connection, it must be taken into account that the surface of the propulsion nozzle 2 cuts off an increasingly greater solid angle of the radiation 5 as the distance from the plasma 4 increases. An optimal distance of the device for opening up the maximum solid angle is given depending on the magnitude of the surface between the propulsion nozzle 2 and the mixing nozzle 10 and the surface of the propulsion nozzle 2. The short distance which may result between the plasma 4 and the propulsion nozzle 2 in this connection is relatively uncritical because the propulsion nozzle 2 is cooled very efficiently by the (adiabatic) expansion taking place in it. This cooling can advantageously be used for components (e.g., electrodes) of the plasma radiation source. A heating of the propellant gas which occurs in this connection is even desirable for the above-stated reasons relating to an increase in the particle velocity in the supersonic gas jet 7.

By means of the device according to the invention, debris can be suppressed in a highly efficient manner while sustaining only a slight loss of useful light so that particularly "dirty" but efficient concepts for the plasma radiation sources are practicable. This refers to laser-induced plasma, plasmas generated by particle bombardment and discharge plasmas.

Figure 2:
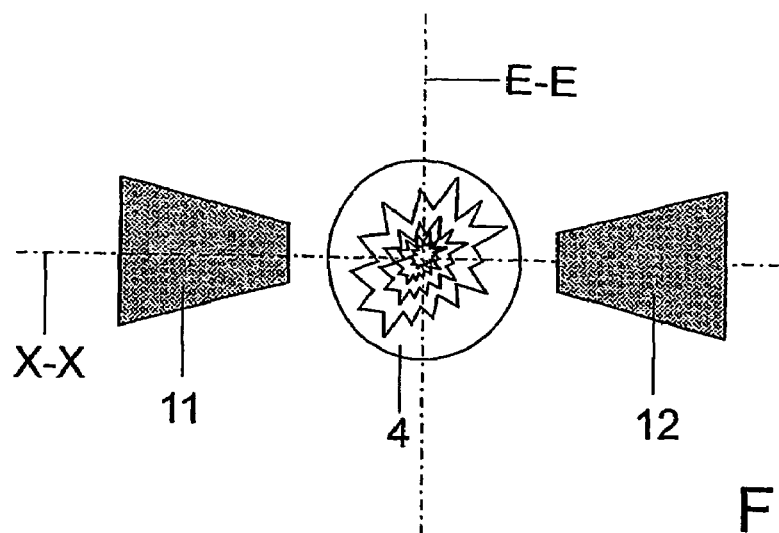
FIG. 2 shows a plasma radiation source constructed as discharge plasma.

In the construction of a discharge plasma radiation source shown in FIG. 2, anodes 11 and cathodes 12 are arranged adjacent to one another along the axis X-X of the mean propagation direction of the radiation in contrast, e.g., to the discharge plasma radiation sources for generating EUV radiation commonly used heretofore. An arrangement of this kind has some advantageous characteristics; in particular it limits the usable solid angle only slightly, since a cone of several degrees around the axis X-X of the collector optics, not shown here, cannot be used in any case. The rest of the solid angle around the plasma 4 is free and can be used in principle. Further, due to its symmetry, this arrangement reinforces the development of the pinch effect which is needed for generating plasmas with high temperatures and density. This compresses the plasma 4 which conducts electric current through the magnetic field which is itself induced at high electric current densities. The plasma 4 can be supplied with electrical power by alternating current, direct current or pulsed direct current. It is only important that the current densities needed for forming the pinch effect are achieved at least temporarily.

Through the use of the device for debris suppression shown in FIG. 1, without limiting the invention, discharge plasmas of the type mentioned above are now practicable for radiation sources, although the electrode consumption produced by high current densities on the electrode surfaces leads to intensive debris emission.

Figure 3:
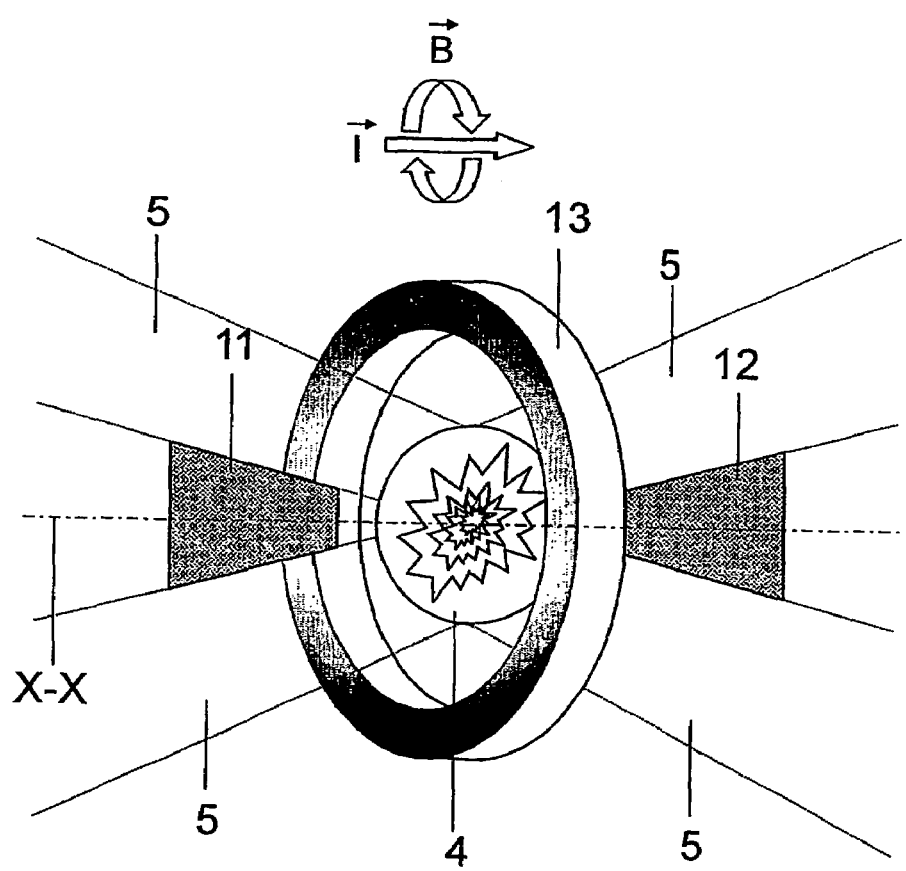
FIG. 3 shows the plasma radiation source according to FIG. 2 with a magnet which is provided in addition.

The pinch effect can be additionally reinforced by an external magnetic field which further increases the compression of the plasma 4 in that the current density increases at a given current strength. This magnetic field can be static or can be adapted to the respective current flow through the plasma 4. An arrangement according to FIG. 3 in which a magnet 13 is additionally arranged around the plasma 4 can be advantageous for this purpose. The annular structure reduces the usable solid angle of the plasma radiation source only slightly and can easily be integrated in the described electrode arrangement according to FIG. 2.

Figure 4:
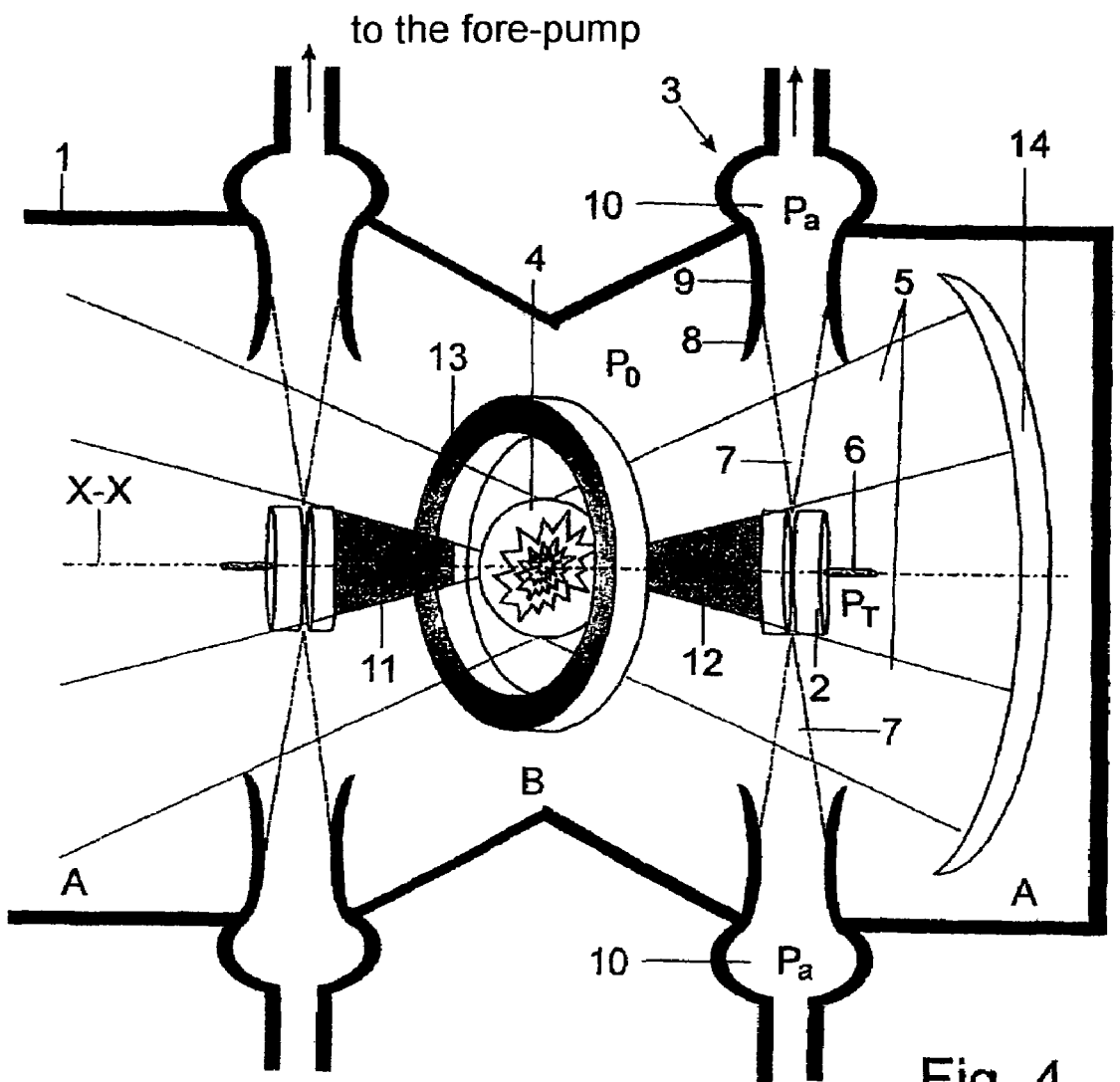
FIG. 4 shows a plasma radiation source for use of the radiation emitted in opposite directions.

Because of a mirror symmetry of the discharge arrangement according to FIG. 2 with respect to a plane E-E extending perpendicular to the axis X-X, the radiation emissions of the plasma 4 can be used on both sides of the plane E-E when a refocusing of the radiation through the plasma 4 is carried out by a spherical mirror 14 serving as reflector. A corresponding arrangement in which the beam paths of both sides are unified in one beam path is shown in FIG. 4.

Like the optical components, not shown, on the opposite side of the plasma 4, the spherical mirror 14 is subjected to debris emission without additional protection. Therefore, according to FIG. 4, the device for debris suppression described in FIG. 1 is also used for the mirror 14.

A suitable emitter can be fed into the plasma 4 in various ways, e.g., externally as gas or liquid, or dissolved, suspended or atomized in a gas or a liquid. It is particularly simple to form the electrodes completely or partially from the emitter element or a plurality of emitter elements so that the emitter is conducted into the plasma 4 through the electrode consumption. In order to maintain the discharge geometry, it may possibly be necessary to readjust the electrodes in order to compensate for consumption.

Figure 5:
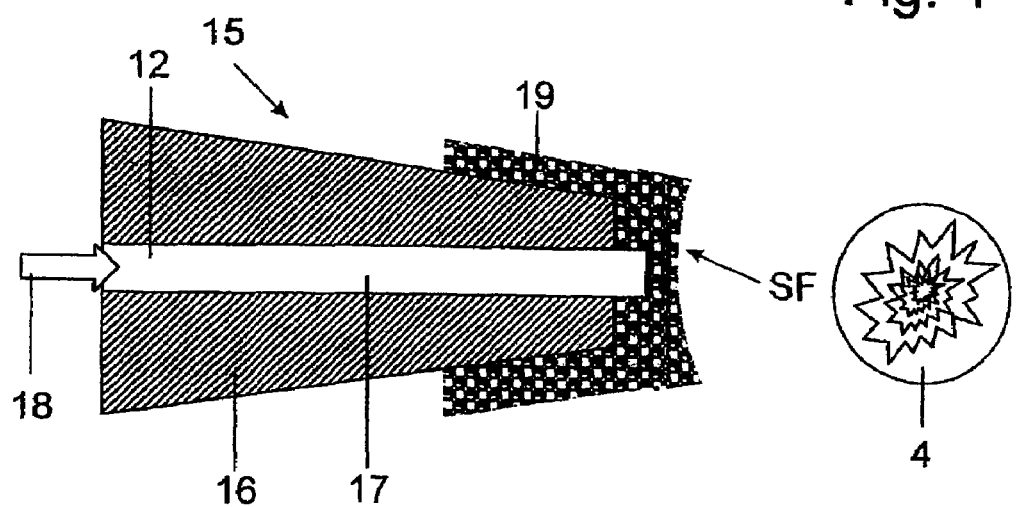
FIG. 5 shows a section through a liquid metal electrode.

This is no longer the case in a particularly advantageous construction of the electrodes formed as liquid metal electrodes of any shape. FIG. 5 shows an electrode of this type in which consumption is also minimized.

When a liquid is brought into contact with a porous material whose porosity is adapted to the surface tension of the liquid, the liquid is distributed uniformly in the porous material until it reaches its surface. When the pressure of the liquid is greater than the pressure at the surface of the porous material, the liquid is pressed uniformly out of the surface, not taking into account effects of gravity.

In the electrode 15 shown in FIG. 5, a carrier 16 is penetrated by a supply channel 17 for supplying the electrode 15 with a liquid emitter 18, e.g., tin or lithium. The carrier 16 is coated with a high-melting porous material 19 at its end facing the plasma. The supply channel 17 opens into this porous material 19 so that the liquid metal emitter 18 exits from the porous material 19 and its surface can be completely coated. A spherical shape SF of the porous material 19 on the plasma side should lead to a uniform current density on the electrode surface and accordingly prevent a local overheating during operation. The porous material 19 is arranged on the portion of the electrode 15 remote of the plasma an additional distance on the carrier 16 in order to enlarge the total surface of the electrode 15 and ensure improved mechanical stability on the carrier 16.

An operating temperature above the melting point of the metal emitter 18 is essential for the function of the electrode 15 in order to prevent its solidification. An additional external heating device can be switched on at the start of operation until the hot plasma 4 maintains the electrode 15 at this temperature, or the switch-on regime is so configured that the plasma 4 heats the electrode 14 to operating temperature.

Since the electrodes of a plasma radiation source are under vacuum, it is easily possible to increase the thickness of the metal film on the surface of the porous material 19 by means of a slight overpressure. If necessary, it is also possible to omit adapting the porosity to the surface tension of the liquid metal.

The proposed construction of the electrode 15 has the further advantage of a long lifetime, since the porous material 19 is efficiently cooled and its consumption is suppressed because liquid metal is constantly evaporated on the surface of the porous material 19 during operation. This applies to the entire electrode 15.

It is possible, but not necessary, for the carrier 16 as well as the porous material 19 to be electrically conductive since the current supply can be carried out via the supply channel 17.

In another embodiment form, the carrier 16 and the porous material 19 can be chemically identical so that mechanical stresses at the interface between the two materials can be prevented during changes in temperature.

The condensation of evaporated emitter material on the surfaces of the vacuum chamber can be prevented by the device for debris suppression according to the invention in that the evaporated emitter material is removed by the gas jet vacuum pump 3. This process can be carried out continuously in operation by means of correspondingly high surface temperatures in the source region B. The precipitated emitter material in the vacuum system can be removed relatively easily in this way.

While the foregoing description and drawings represent the present invention, it will be obvious to those skilled in the art that various changes may be made therein without departing from the true spirit and scope of the present invention.

The invention claimed is:

1. The plasma radiation source comprising:

a source region in a vacuum chamber for emitting radiation at a defined solid angle along an axis of the mean direction of propagation of the radiation through a gas curtain that is provided for debris suppression;

said gas curtain being a radially directed supersonic gas jet, proceeds from a propulsion nozzle of a gas jet vacuum pump;

said propulsion nozzle being arranged on an axis of the mean propagation direction of the radiation; and said gas curtain being directed to an annular mixing nozzle of the gas jet vacuum pump arranged coaxial to the axis and being guided out of the vacuum chamber by a diffuser.

2. The plasma radiation source according to claim 1, wherein a discharge is used for plasma excitation and an electrode arrangement with anodes and cathodes arranged next to one another along the axis of the mean propagation direction of the radiation is provided for the discharge.

3. The plasma radiation source according to claim 2, wherein liquid metal electrodes are used as electrodes.

4. The plasma radiation source according to claim 3, wherein the liquid metal electrode has a carrier which is penetrated by a supply channel for a liquid emitter and which is coated at its end facing the plasma with a high-melting porous material into which the supply channel opens.

5. The plasma radiation source according to claim 3, wherein the liquid metal electrode is outfitted with a heating device.

6. The plasma radiation source according to claim 4, wherein the carrier and the porous material are electrically conductive.

7. The plasma radiation source according to claim 4, wherein the carrier and the porous material are not electrically conductive.

8. The plasma radiation source according to claim 6, wherein the carrier and the porous material are chemically identical.

9. The plasma radiation source according to claim 2, wherein a pinch effect generated by a current flow along the axis is additionally supported by an external magnetic field around the plasma.

10. The plasma radiation source according to claim 9, wherein the external magnetic field is formed as a static magnetic field.

11. The plasma radiation source according to claim 9, wherein the external magnetic field is adapted to the current flow through the plasma.

12. The plasma radiation source according to claim 1, wherein laser radiation is used to excite plasma.

13. The plasma radiation source according to claim 1, wherein a reflector is provided adjacent to a source region for the plasma along the axis of the mean propagation direction of the radiation, which reflector refocuses the radiation through the plasma.

14. The plasma radiation source according to claim 1, wherein the gas curtain is adjacent to the source region along the axis of the mean propagation direction of the radiation exclusively on the side of an application region.

15. The plasma radiation source according to claim 13, wherein the gas curtain is adjacent to the source region along the axis of the mean propagation direction of the radiation on both sides.

16. An arrangement for generating a gas curtain as a filter for particles in radiation whose mean propagation direction extends in a vacuum chamber along an axis directed through the gas curtain, comprising:

a gas jet vacuum pump with a propulsion nozzle being arranged on an axis for generating a supersonic gas jet for the gas curtain and directing the supersonic gas jet radially to an annular mixing nozzle of the gas jet vacuum pump;

said mixing nozzle being arranged coaxial to the axis; and a diffuser being provided for guiding the supersonic gas jet out of the vacuum chamber.

17. A gas jet vacuum pump comprising:

an annular mixing nozzle having a gas inlet opening which faces the annular center;

a propulsion nozzle being arranged in the annular center for generating a supersonic gas jet that proceeds radially from the propulsion nozzle and is directed to the gas inlet opening; and an annular diffuser which works so as to direct the gas away from the annular center.

* * * * *